United States Patent
Urakawa

(10) Patent No.: US 8,922,241 B2
(45) Date of Patent: Dec. 30, 2014

(54) LOGIC CIRCUIT AND SEMICONDUCTOR INTEGRATED CIRCUIT

(75) Inventor: Tatsuya Urakawa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 29 days.

(21) Appl. No.: 13/610,341

(22) Filed: Sep. 11, 2012

(65) Prior Publication Data
US 2013/0082734 A1 Apr. 4, 2013

(30) Foreign Application Priority Data
Sep. 30, 2011 (JP) ................. 2011-216397

(51) Int. Cl.
*H03K 17/16* (2006.01)
*H03K 19/003* (2006.01)
*H03K 19/0175* (2006.01)
*H03K 19/094* (2006.01)

(52) U.S. Cl.
CPC ............................. *H03K 19/00369* (2013.01)
USPC ................. 326/33; 326/82; 327/538

(58) Field of Classification Search
CPC ............. H03K 19/00; H03K 19/0175; H03K 19/0016; H03K 19/00315; G06F 3/262; G06F 3/265; G06F 3/205; G06F 3/30
USPC ............................................ 326/33; 327/538
See application file for complete search history.

(56) References Cited

U.S. PATENT DOCUMENTS

| | | | |
|---|---|---|---|
| 5,140,183 A * | 8/1992 | Takenaka | 327/543 |
| 6,104,221 A * | 8/2000 | Hoon | 327/143 |
| 6,674,304 B1 * | 1/2004 | Matthews | 326/80 |
| 6,906,944 B2 * | 6/2005 | Takeuchi et al. | 365/145 |
| 7,098,699 B2 * | 8/2006 | Tamura et al. | 327/108 |
| 2006/0235630 A1 * | 10/2006 | Ito et al. | 702/57 |
| 2010/0039142 A1 * | 2/2010 | Lee et al. | 327/77 |
| 2013/0076401 A1 * | 3/2013 | Lee et al. | 327/77 |

FOREIGN PATENT DOCUMENTS

| | | | |
|---|---|---|---|
| JP | 06-077805 A | 3/1994 | |
| JP | 09-036727 A | 2/1997 | |

* cited by examiner

*Primary Examiner* — Dylan White
(74) *Attorney, Agent, or Firm* — Sughrue Mion, PLLC

(57) ABSTRACT

Provided is a logic circuit that can reduce the variation of a power supply voltage supplied thereto and a semiconductor integrated circuit including the logic circuit. The logic circuit includes a buffer unit, a voltage detection unit, and a switch unit. The buffer unit is connected between a first power supply or a voltage regulator and a second power supply to receive power supply, and outputs a signal having the same or inverted logic level as an input signal to an output terminal. The voltage detection unit detects a voltage at the output terminal and outputs a detection signal based on a detection result. The switch unit connects the buffer unit to the first power supply or the voltage regulator in accordance with the detection signal.

16 Claims, 14 Drawing Sheets

LOGIC CIRCUIT AND SEMICONDUCTOR INTEGRATED CIRCUIT

CROSS-REFERENCE TO RELATED APPLICATIONS

This application is based upon and claims the benefit of priority from Japanese patent application No. 2011-216397, filed on Sep. 30, 2011, the disclosure of which is incorporated herein in its entirety by reference.

BACKGROUND

The present invention relates to a logic circuit and a semiconductor integrated circuit.

A buffer circuit, which is a logic circuit that outputs a positive logic level, is widely used in a semiconductor integrated circuit and the like today for the purpose of enhancing the driving capability and the like. Generally, the buffer circuit is configured to output an input logic value as it is. Various configuration examples of the buffer circuit have been proposed (Japanese Unexamined Patent Application Publication No. 06-77805, for example).

FIG. 10 is a circuit diagram showing a configuration of a typical buffer circuit 500. As shown in FIG. 10, the buffer circuit 500 includes an input terminal 51, an inverter circuit 52, a first delay difference generator 53, a second delay difference generator 54, a PMOS transistor 55, an NMOS transistor 56, and an output terminal 57. The input end of the inverter circuit 52 is connected to the input terminal 51. The input end of the first delay difference generator 53 is connected to the output end of the inverter circuit 52, and the first delay difference generator 53 causes a difference in delay to occur between the rising edge delay time and the falling edge delay time of an input signal IN. The input end of the second delay difference generator 54 is connected to the output end of the inverter circuit 52, and the second delay difference generator 54 causes a difference in delay, which is different from the difference caused by the first delay difference generator 53, to occur between the rising edge delay time and the falling edge delay time of the input signal IN. The source electrode of the PMOS transistor 55 is connected to a first power supply (an internal power supply voltage VINT), the drain electrode thereof is connected to the output terminal 57, and the gate electrode thereof is connected to the output end of the first delay difference generator 53. The source electrode of the NMOS transistor 56 is connected to a second power supply (a ground voltage GND), the drain electrode thereof is connected to the output terminal 57, and the gate electrode thereof is connected to the output end of the second delay difference generator 54.

FIG. 11 is a timing chart showing an operation of the buffer circuit 500. In the buffer circuit 500, the first delay difference generator 53 causes a delay difference to occur so that the falling edge delay time $t_{PHL1}$ is greater than the rising edge delay time $t_{PLH1}$, and the second delay difference generator 54 causes a delay difference to occur so that the falling edge delay time $t_{PHL2}$ is smaller than the rising edge delay time $t_{PLH2}$, for example. As a result, the input signal IN that is input to the input terminal 51 is inverted by the inverter circuit 52 into an inverted output signal Va. A delay occurs in the falling edge of a gate voltage Vb by the first delay difference generator 53. On the other hand, a delay occurs in the rising edge of a gate voltage Vc by the second delay difference generator 54.

Because a MOS transistor turns ON when the gate voltage is $|V_{GS}-V_{th}| \geq 0$ ($V_{GS}$ is a gate-source voltage, and $V_{th}$ is a threshold voltage of a single transistor), a PMOS transistor generally becomes ON when an input is at "L" level, and an NMOS transistor generally becomes ON when an input is at "H" level. It is thereby possible to prevent the PMOS transistor 55 and the NMOS transistor 56 from becoming ON state simultaneously upon switching of the input signal IN by the first and second delay difference generators 53 and 54. Because there is a period when the PMOS transistor 55 and the NMOS transistor 56 are both OFF (periods of $t_{PHL1}$-$t_{PHL2}$ and $t_{PLH2}$-$t_{PLH1}$ in FIG. 11), an instantaneous through current $I_t$ decreases. Note that, OUT in FIG. 11 is an output signal that is output to the output terminal 57.

Further, a technique that reduces switching noise by switching the power supply is disclosed as another example of a buffer circuit (Japanese Unexamined Patent Application Publication No. 09-36727).

SUMMARY

However, the inventor has found that the above-described buffer circuit has the following problems. FIG. 12 is a block diagram showing an example of use of the buffer circuit 500. A voltage regulator 1 converts an external power supply voltage VDD that is supplied through a power supply terminal $t_{s1}$ into a constant internal power supply voltage VINT. FIG. 13 is a graph showing a relationship between the external power supply voltage VDD and the internal power supply voltage VINT. In FIG. 13, a constant value that is a target value of the internal power supply voltage VINT is indicated as VINT0.

The buffer circuit 500 receives the internal power supply voltage VINT from the voltage regulator 1. Specifically, the internal power supply voltage VINT and the ground voltage GND are supplied to the buffer circuit 500. The buffer circuit 500 is supplied with the ground voltage GND through a power supply terminal $T_{s2}$. Further, the buffer circuit 500 is supplied with the internal power supply voltage VINT from the voltage regulator 1. The input of the buffer circuit 500 is connected to the input terminal $T_{in}$, and the input signal IN is input therethrough. A signal with periodicity such as a clock signal, for example, is input as the input signal IN to the buffer circuit 500. The buffer circuit 500 then outputs the output signal OUT through the output terminal $T_{out}$.

Further, a load $C_{load}$ is connected between the output of the buffer circuit 500 and the power supply terminal $T_{s2}$. Note that the load $C_{load}$ is the capacitance of a circuit block that receives the output signal OUT from the buffer circuit 500. A peripheral circuit 2 is connected between the output of the voltage regulator 1 and the power supply terminal $T_{s2}$. Note that the peripheral circuit 2 is a circuit block, different from the buffer circuit 500, that operates with the internal power supply voltage VINT received from the voltage regulator 1.

In general, when a signal with periodicity such as a clock signal is input to a buffer circuit, the buffer circuit outputs a signal with the same periodicity. At this time, the through current flows through the buffer circuit in concurrence with a change in output level as described above. When the amount of through current is large, the internal power supply voltage VINT drops temporarily each time the output level of the buffer circuit changes. FIG. 14 is a graph showing a relationship between the internal power supply voltage VINT and the output current IINT of the voltage regulator 1. As shown in FIG. 14, the internal power supply voltage VINT decreases with an increase in the output current IINT.

Accordingly, despite that the voltage regulator 1 is used for the purpose of supplying a constant voltage, the voltage of the internal power supply voltage VINT, which should be constant, varies. As a result, despite that the internal power supply voltage VINT should be supplied as a constant DC voltage, noise with a certain frequency is superimposed thereupon if the voltage variation occurs periodically. When this occurs, the quality of the internal power supply voltage VINT that is supplied to the peripheral circuit 2 is deteriorated, which causes the peripheral circuit 2 to stop or malfunction.

Because the through current is reduced in the above-described buffer circuit 500, the variation of the internal power supply voltage VINT is expected to be low. However, the inventor has conducted further study and found out that the variation of the internal power supply voltage VINT cannot be sufficiently reduced in the buffer circuit 500. As shown in FIG. 12, when the load $C_{load}$ is connected to the output of the buffer circuit 500, charge and discharge of the load $C_{load}$ are made in concurrence with a change in the output signal OUT. At this time, a driving current $I_d$ flows during charging.

FIG. 15 is a circuit diagram showing current paths of the through current $I_t$ and the driving current $I_d$ in the buffer circuit 500. The buffer circuit 500 shown in FIG. 15 is the same as that of FIG. 10 except that the load $C_{load}$ is connected to the output terminal $T_{out}$ and thus not redundantly described. The driving current $I_d$ flows through the path that goes through the PMOS transistor 55 and the load $C_{load}$. Thus, when the driving current $I_d$ flows, the internal power supply voltage VINT decreases. The driving current $I_d$ varies depending on the size of the load $C_{load}$, and, when a large load $C_{load}$ is connected, the driving current $I_d$ can be larger than the through current $I_t$ and have a dominant effect on the variation of the internal power supply voltage VINT.

It is thus understandable that the variation of the internal power supply voltage VINT by the driving current $I_d$ cannot be suppressed in the buffer circuit 500, and the purpose of using the voltage regulator 1 cannot be attained.

A first aspect of the present invention is a logic circuit that includes a buffer unit that is connected between a first power supply or a voltage regulator and a second power supply to receive power supply, and outputs a signal having the same or inverted logic level as an input signal to an output terminal, a voltage detection unit that detects a voltage at the output terminal and outputs a detection signal based on a detection result, and a switch unit that connects the buffer unit to the first power supply or the voltage regulator in accordance with the detection signal. In this logic circuit, when a change occurs in the level of the input signal and a driving voltage flows through a load connected to the output terminal, the buffer unit is connected to the first power supply. This reduces the variation of a voltage that is output from the voltage regulator.

A second aspect of the present invention is a logic circuit that includes a buffer unit that is connected between a first power supply or a third power supply and a second power supply to receive power supply, and outputs a signal having the same or inverted logic level as an input signal to an output terminal, a voltage detection unit that detects a voltage at the output terminal and outputs a detection signal based on a detection result, and a switch unit that connects the buffer unit to the first power supply or the third power supply in accordance with the detection signal. In this logic circuit, when a change occurs in the level of the input signal and a driving voltage flows through a load connected to the output terminal, the buffer unit is connected to the first power supply. This reduces the variation of a voltage that is output from the third power supply.

According to the aspect of the present invention, it is possible to provide a logic circuit that can reduce the variation of a power supply voltage supplied thereto and a semiconductor integrated circuit into which the logic circuit is incorporated.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Embodiments of the present invention will be described hereinafter with reference to the drawings. In the figures, the identical reference symbols denote identical structural elements and the redundant explanation thereof is omitted as appropriate.

First Embodiment

Figure 1:
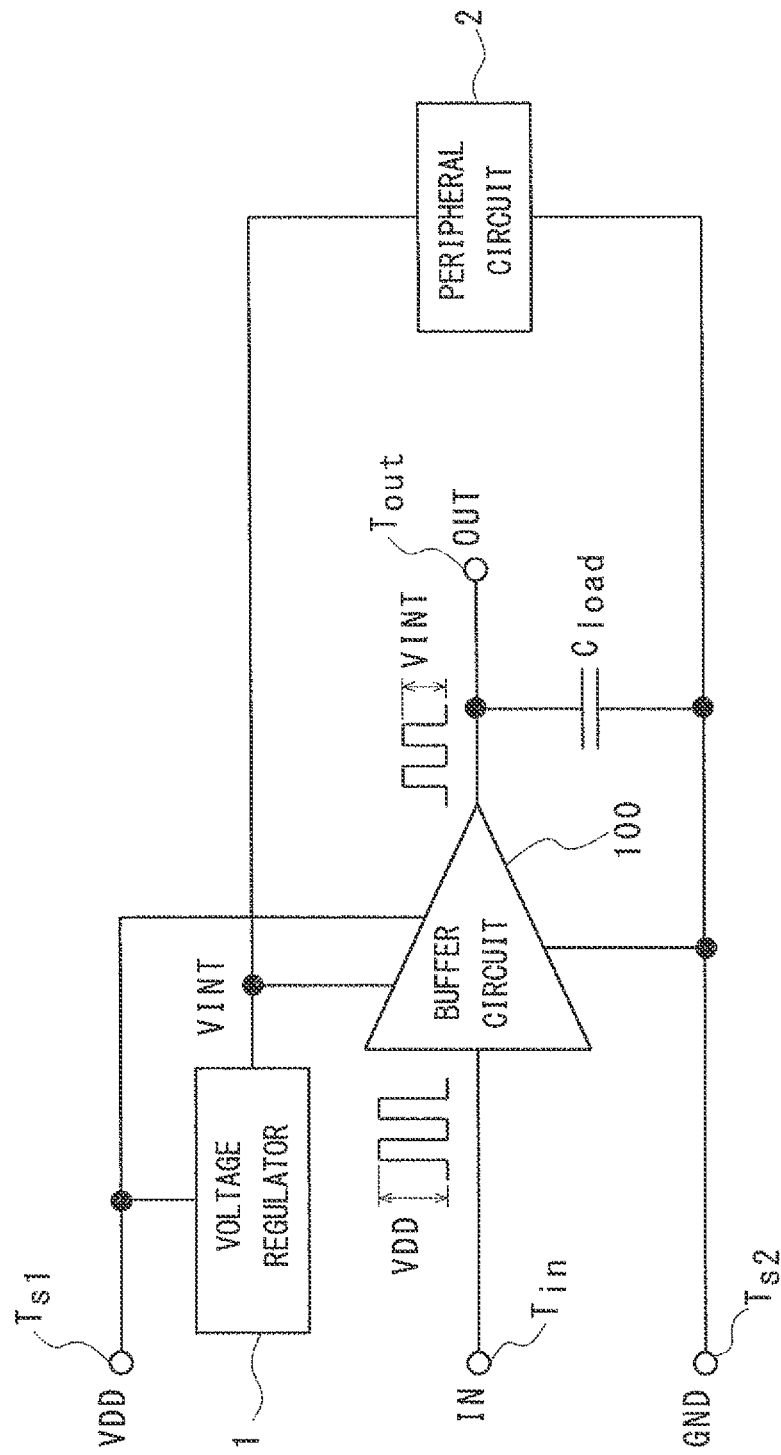
FIG. 1 is a block diagram showing an aspect of use of a buffer circuit 100 according to a first embodiment.

A buffer circuit 100 according to a first embodiment of the present invention is described firstly. The buffer circuit 100 is configured as a logic circuit that outputs a signal having the same logic level as that of an input signal. FIG. 1 is a block diagram showing an aspect of use of the buffer circuit 100 according to the first embodiment. A voltage regulator 1 converts an external power supply voltage VDD that is supplied through a power supply terminal $T_{s1}$ into an internal power supply voltage VINT having a constant value. The buffer circuit 100 is supplied with the external power supply voltage VDD and the ground voltage GND through power supply terminals $T_{s1}$ and $T_{s2}$, respectively. Further, the buffer circuit 100 is supplied with the internal power supply voltage VINT from the voltage regulator 1. The input of the buffer circuit 100 is connected to an input terminal $T_{in}$, and the input signal IN is input. Note that the external power supply voltage VDD corresponds to a voltage of a first power supply, the ground voltage GND corresponds to a voltage of a second power supply, and the voltage regulator 1 corresponds to a third power supply.

A signal with periodicity such as a clock signal, for example, is input as the input signal IN to the buffer circuit 100. The buffer circuit 100 then outputs a signal having the same logic level as that of the input signal IN as an output signal OUT through the output terminal $T_{out}$. Specifically, a clock signal CLK1 having the amplitude of the external power supply voltage VDD is input to the buffer circuit 100. The buffer circuit 100 then outputs a clock signal CLK2 having the amplitude of the internal power supply voltage VINT.

Further, a load $C_{load}$ is connected between the output of the buffer circuit 100 and the power supply terminal $T_{s2}$. Note that the load $C_{load}$ is the capacitance of a circuit block that receives the output signal OUT from the buffer circuit 100. A peripheral circuit 2 is connected between the output of the voltage regulator 1 and the power supply terminal $T_{s2}$. Note that the peripheral circuit 2 is a circuit block, different from the buffer circuit 100, that operates with the internal power supply voltage VINT received from the voltage regulator 1.

Figure 2:
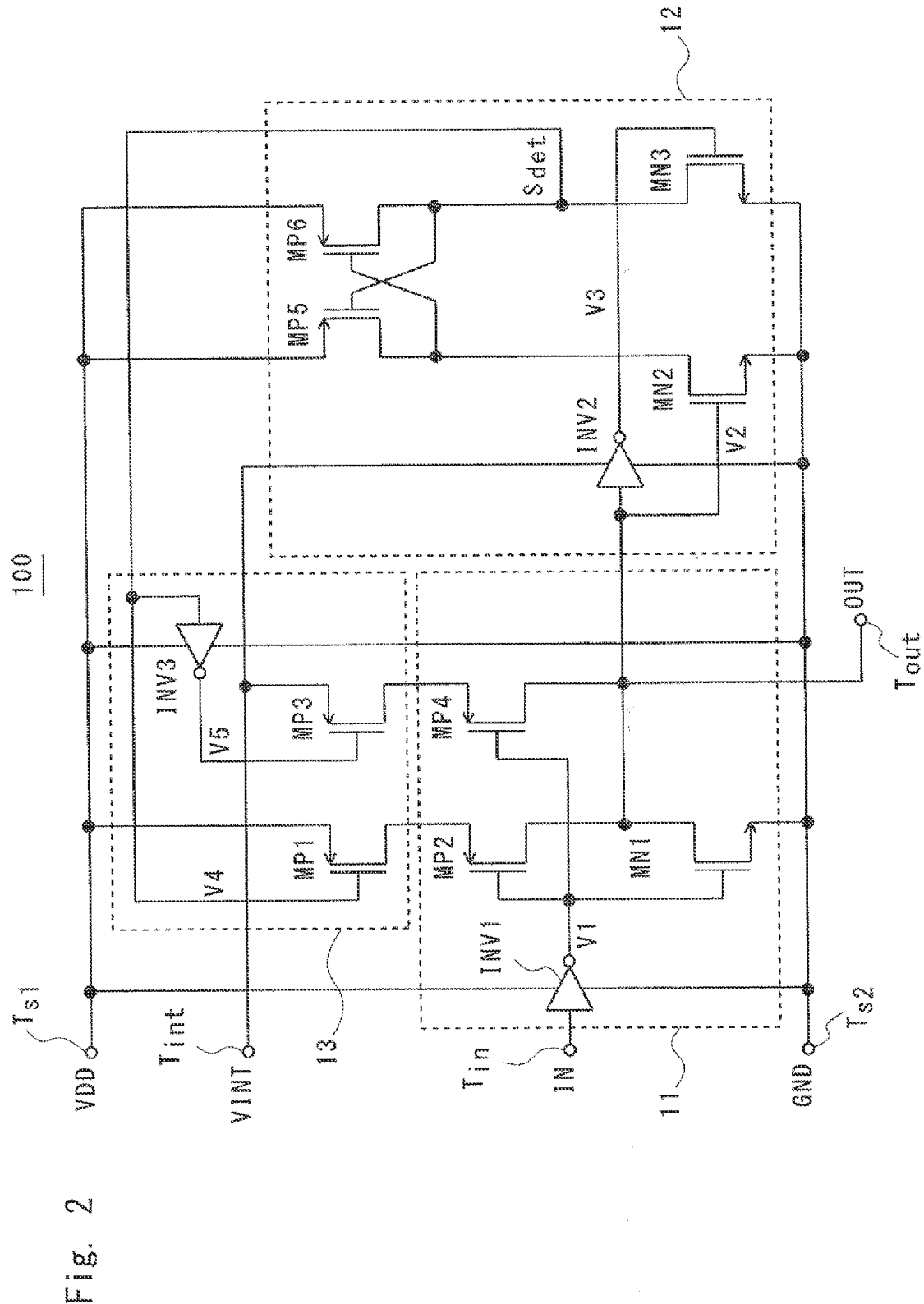
FIG. 2 is a circuit diagram showing a configuration of the buffer circuit 100 according to the first embodiment.

A configuration of the buffer circuit 100 is specifically described hereinafter with reference to the drawings. FIG. 2 is a circuit diagram showing a configuration of the buffer circuit 100 according to the first embodiment. The buffer circuit 100 includes a buffer unit 11, a voltage detection unit 12, and a switch unit 13.

The buffer unit 11 includes PMOS transistors MP2 and MP4, NMOS transistor MN1, and inverter INV1. The drains of the PMOS transistors MP2 and MP4 are connected to the drain of the NMOS transistor MN1. Further, the drains of the PMOS transistors MP2 and MP4 are connected to the output terminal $T_{out}$ to output the output signal OUT. The source of the NMOS transistor MN1 is connected to the power supply terminal $T_{s2}$ (the ground voltage GND). The input of the inverter INV1 is connected to the input terminal $T_{in}$ to input the input signal IN. The output of the inverter INV1 is connected to the gates of the PMOS transistors MP2 and MP4 and the NMOS transistor MN1. Thus, the PMOS transistors MP2 and MP4 and the NMOS transistor MN1 turn ON or OFF in a complementary fashion according to a change in the level of the input signal IN. The inverter INV1 is connected to the power supply terminals $T_{s1}$ (the external power supply voltage VDD) and $T_{s2}$ (the ground voltage GND) to receive power supply. Note that the PMOS transistors MP2 and MP4 and the NMOS transistor MN1 correspond to first to third transistors, respectively. Further, the gate terminals of the PMOS transistors MP2 and MP4 and the NMOS transistor MN1 correspond to control terminals of the first to third transistors, respectively.

The voltage detection unit 12 includes PMOS transistors MP5 and MP6, NMOS transistors MN2 and MN3, and inverter INV2. The sources of the PMOS transistors MP5 and MP6 are connected to the power supply terminal $T_{s1}$ and supplied with the external power supply voltage VDD. The drains of the PMOS transistors MP5 and MP6 are connected to the drains of the NMOS transistors MN2 and MN3, respectively. A detection signal $S_{det}$ is output from the drain of the PMOS transistor MP6. The sources of the NMOS transistors MN2 and MN3 are connected to the power supply terminal $T_{s2}$ and supplied with the ground voltage GND. The gate of the PMOS transistor MP5 is connected to the drain of the PMOS transistor MP6. The gate of the PMOS transistor MP6 is connected to the drain of the PMOS transistor MP5.

The output signal OUT is input to the gate of the NMOS transistor MN2. An inverted signal of the output signal OUT is input to the gate of the NMOS transistor MN3 through the inverter INV2. Thus, the NMOS transistors MN2 and MN3 turn ON or OFF in a complementary fashion according to the output signal OUT. The inverter INV2 is connected to the terminal $T_{int}$ (the internal power supply voltage VINT) and the power supply terminal $T_{s2}$ (the ground voltage GND) to receive power supply.

The switch unit 13 includes PMOS transistors MP1 and MP3 and inverter INV3. The source of the PMOS transistor MP1 is connected to the power supply terminal $T_{s1}$ and supplied with the external power supply voltage VDD. The drain of the PMOS transistor MP1 is connected to the source of the PMOS transistor MP2. The source of the PMOS transistor MP3 is supplied with the internal power supply voltage VINT from the voltage regulator 1 through the terminal $T_{int}$. The drain of the PMOS transistor MP3 is connected to the source of the PMOS transistor MP4.

The detection signal $S_{det}$ is input to the gate of the PMOS transistor MP1. An inverted signal of the detection signal $S_{det}$ is input to the gate of the PMOS transistor MP3 through the inverter INV3. Thus, the PMOS transistors MP1 and MP3 turn ON or OFF in a complementary fashion according to the detection signal $S_{det}$. The inverter INV3 is connected to the power supply terminals $T_{s1}$ (the external power supply voltage VDD) and $T_{s2}$ (the ground voltage GND) to receive power supply.

Figure 3:
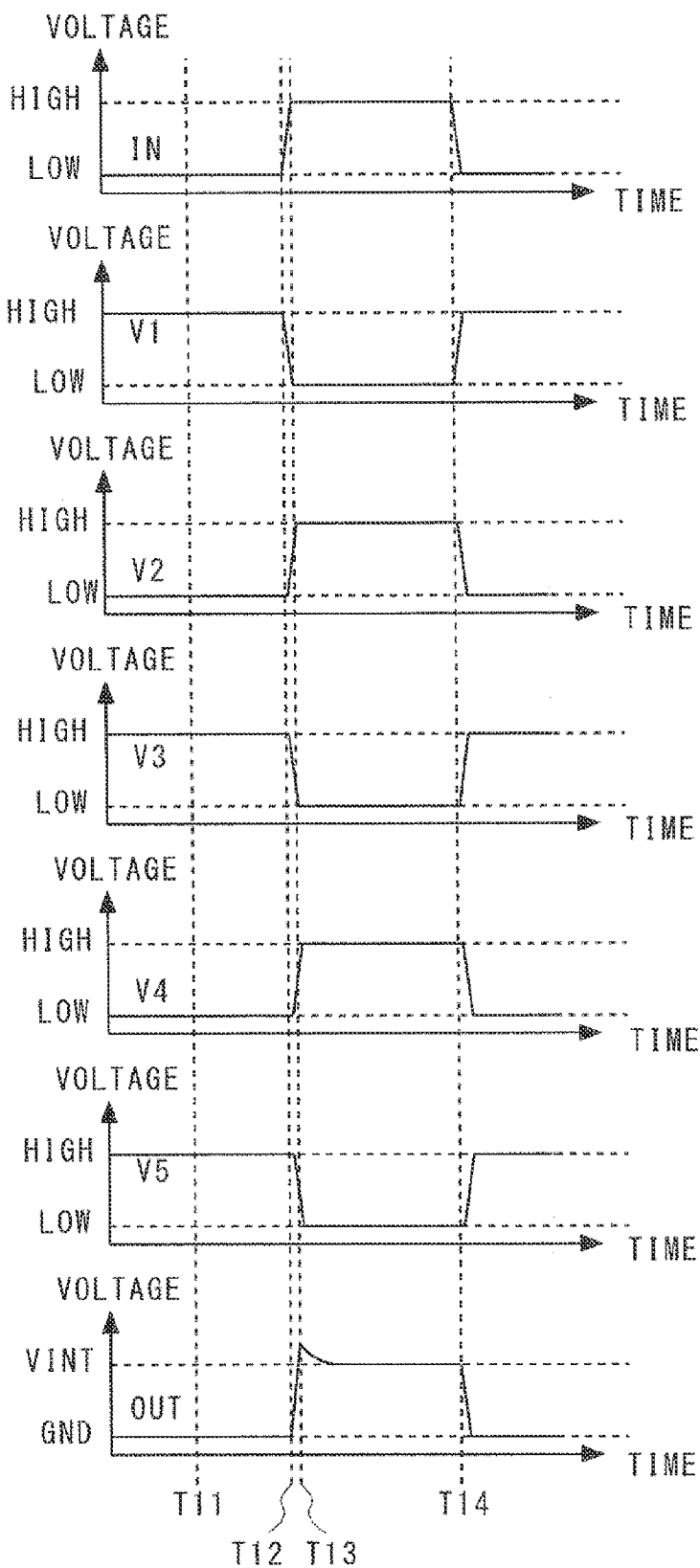
FIG. 3 is a timing chart schematically showing an operation of the buffer circuit 100 according to the first embodiment.

An operation of the buffer circuit 100 is described hereinbelow. FIG. 3 is a timing chart schematically showing an operation of the buffer circuit 100 according to the first embodiment. It is assumed that the input signal IN is LOW in the initial state (timing T11 in FIG. 3). At this time, a voltage V1 of the buffer unit 11 is HIGH. Accordingly, the NMOS transistor MN1 is ON and the PMOS transistors MP2 and MP4 are OFF, and thus the output signal OUT is LOW.

When the output signal OUT is LOW, a voltage V2 is LOW and a voltage V3 is HIGH in the voltage detection unit 12, and therefore the NMOS transistor MN2 is OFF and the NMOS transistor MN3 is ON. Accordingly, the PMOS transistor MP5 is ON and the PMOS transistor MP6 is OFF, and thus the detection signal $S_{det}$ is LOW.

When the detection signal $S_{det}$ is LOW, a voltage V4 is LOW and a voltage V5 is HIGH in the switch unit 13. Accordingly, the PMOS transistor MP1 is ON and the PMOS transistor MP3 is OFF.

Figure 4:
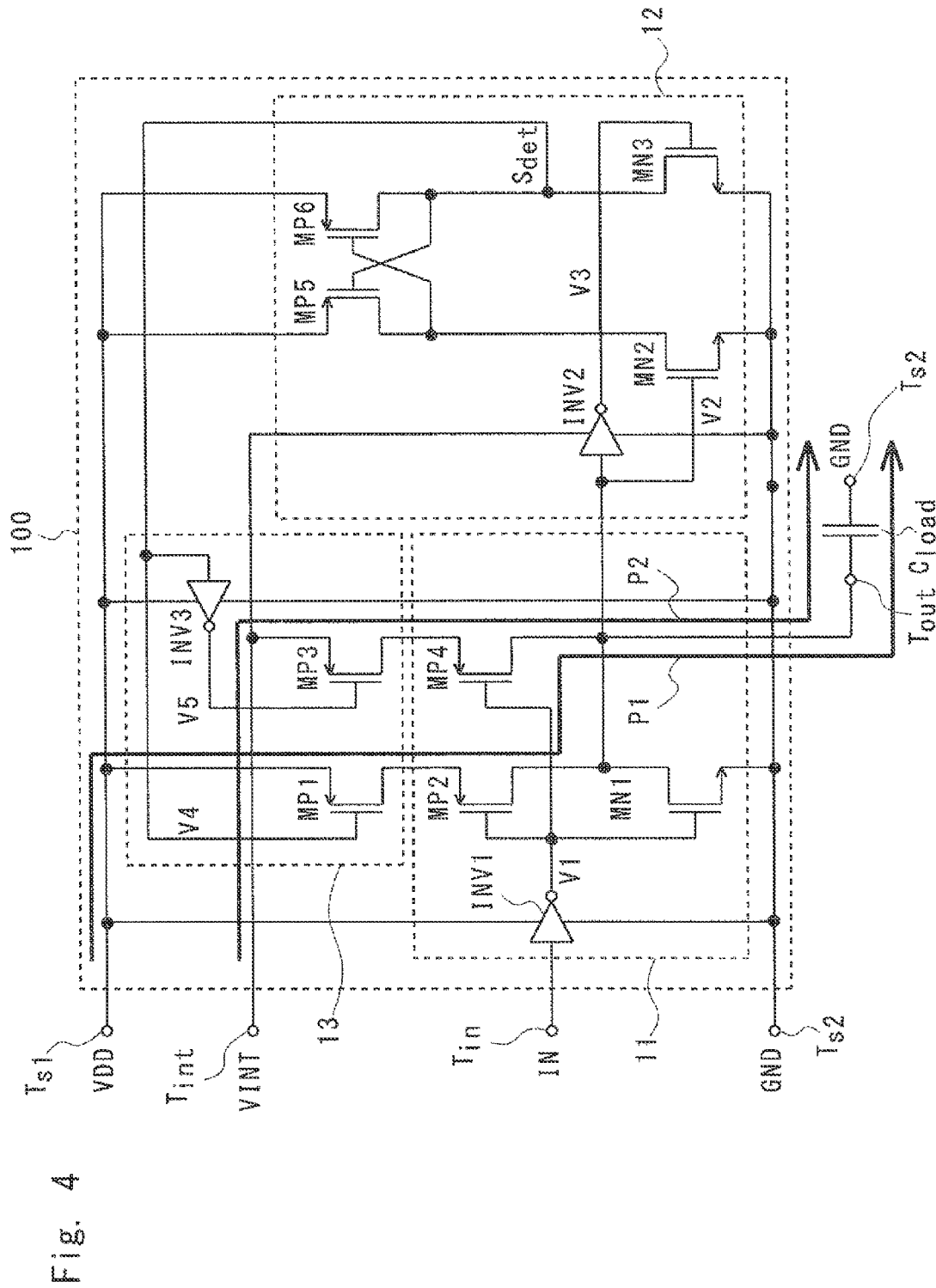
FIG. 4 is a circuit diagram showing a current path in the buffer circuit 100 according to the first embodiment.

In this state, a case where the input signal IN changes from LOW to HIGH is as follows. When the input signal IN changes from LOW to HIGH (timing T12 in FIG. 3), the voltage V1 of the buffer unit 11 changes from HIGH to LOW. Accordingly, the NMOS transistor MN1 turns OFF, and the PMOS transistors MP2 and MP4 turn ON. At this time, because the PMOS transistor MP1 is ON and the PMOS transistor MP3 is OFF as described above, a current path that goes through the power supply terminal $T_{s1}$ (the external power supply voltage VDD), the PMOS transistor MP1, the PMOS transistor MP2, the output terminal $T_{out}$, the load $C_{load}$, and the power supply terminal $T_{s2}$ (the ground voltage GND) is formed, and the driving current $I_d$ flows through the path. The current path is referred to hereinafter as P1. FIG. 4 is a circuit diagram showing the current path of the buffer circuit 100 according to the first embodiment. The configuration of the buffer circuit 100 is the same as that of FIG. 2 and thus not redundantly described. As the load $C_{load}$ is charged by the driving current $I_d$, the output signal OUT changes from LOW to HIGH.

When the output signal OUT changes from LOW to HIGH, the voltage V2 changes from LOW to HIGH and the voltage V3 changes from HIGH to LOW in the voltage detection unit 12, and the NMOS transistor MN2 turns ON and the NMOS transistor MN3 turns OFF. Accordingly, because the PMOS transistor MP6 turns ON and the PMOS transistor MP5 turns OFF, the detection signal $S_{det}$ changes from LOW to HIGH. In other words, the voltage detection unit 12 detects a voltage change in the output signal OUT and then changes the voltage level of the detection signal $S_{det}$.

Because the detection signal $S_{det}$ changes from LOW to HIGH, the voltage V4 changes from LOW to HIGH in the switch unit 13 (timing T13 in FIG. 3). Accordingly, the PMOS transistor MP1 turns OFF. Consequently, the current path P1 is closed. Further, the voltage V5 changes from HIGH to LOW (timing T13 in FIG. 3). Accordingly, the PMOS transistor MP3 turns ON. Consequently, a new current path that goes through the terminal $T_{int}$ (the internal power supply voltage VINT), the PMOS transistor MP3, the PMOS transistor MP4, the output terminal $T_{out}$, the load $C_{load}$, and the power supply terminal $T_{s2}$ (the ground voltage GND) is formed. The current path is referred to hereinafter as P2 (see FIG. 4).

Thus, the switch unit 13 switches the current path through which the driving current $I_d$ flows in accordance with a voltage change of the detection signal $S_{det}$. Stated differently, the switch unit 13 switches the power supply voltage that is connected to the buffer unit 11 from the external power supply voltage VDD to the internal power supply voltage VINT. As a result, the load $C_{load}$ is charged up to the internal power supply voltage VINT, and therefore the voltage of the output signal OUT becomes the internal power supply voltage VINT in the end.

As described above, when the output signal OUT changes from LOW to HIGH, the buffer circuit 100 supplies a driving voltage to the external load $C_{load}$. At this time, just after the output signal OUT changes from LOW to HIGH, the buffer circuit 100 supplies the external power supply voltage VDD to the external load $C_{load}$, bypassing the voltage regulator 1 (timing T12 in FIG. 3). This allows the buffer circuit 100 not to receive power supply from the voltage regulator 1 during the period when a large driving current flows, so that the internal power supply voltage VINT does not decrease.

After that, at the timing when the load $C_{load}$ is charged and the driving current $I_d$ is lowered, the buffer circuit 100 supplies the internal power supply voltage VINT to the external load $C_{load}$ (timing T13 in FIG. 3). The buffer circuit 100 can thereby supply the internal power supply voltage VINT that is supposed to be output.

Figure 5:
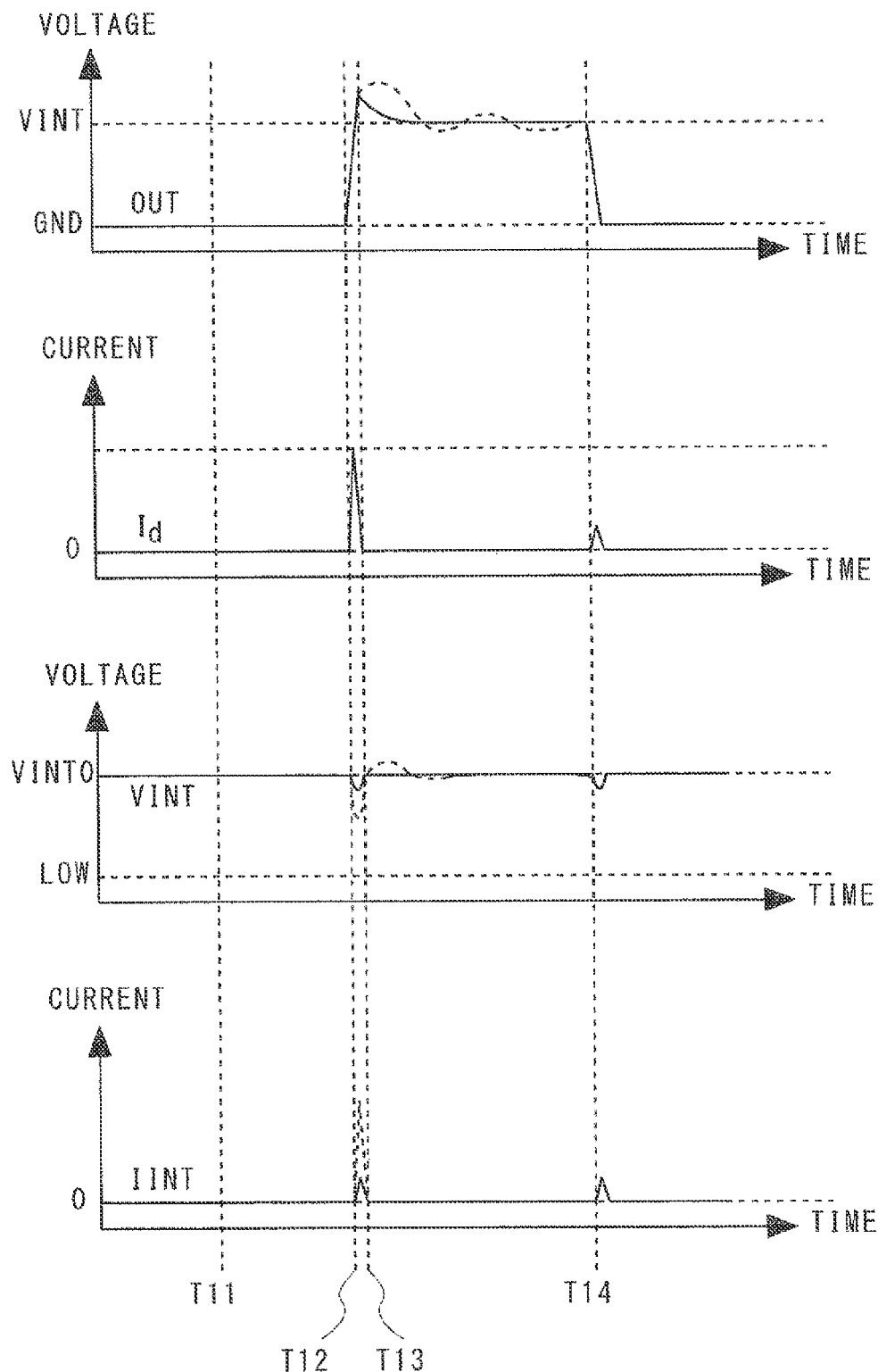
FIG. 5 is a timing chart showing a relationship of an output signal OUT and a driving current $I_d$ of the buffer circuit 100 according to the first embodiment, and an internal power supply voltage VINT and an output current IINT of a voltage regulator 1.

FIG. 5 is a timing chart showing a relationship of the output signal OUT and the driving current $I_d$ of the buffer circuit 100 according to the first embodiment, and the internal power supply voltage VINT and the output current IINT of the voltage regulator 1. In FIG. 5, a target constant value of the internal power supply voltage VINT is indicated as VINT0. Further, the voltage and current waveforms of a typical buffer circuit are shown by a dotted line. Because the large driving current $I_d$ flows through the current path P1 in the buffer circuit 100, the output current IINT of the voltage regulator 1 is kept low. Consequently, the variation of the internal power supply voltage VINT is reduced. In other words, the buffer circuit 100 can prevent the variation of the internal power supply voltage VINT by switching a power supply source each time the large driving current $I_d$ flows. Note that the state where the buffer circuit 100 supplies the driving current $I_d$ to the external load $C_{load}$ (timing T12 to T14 in FIGS. 3 and 5) is referred to hereinafter as a driving state.

Referring back to FIG. 3, the operation of the buffer circuit 100 is further described. A case where the input signal IN changes from HIGH to LOW is as follows. When the input signal IN changes from HIGH to LOW (timing T14 in FIG. 3), the voltage V1 of the buffer unit 11 changes from LOW to HIGH. Accordingly, the NMOS transistor MN1 turns ON, and the PMOS transistors MP2 and MP4 turn OFF. Therefore, the output signal OUT changes from HIGH to LOW. The buffer unit 11 thereby returns to the initial state.

When the output signal OUT changes from HIGH to LOW, the voltage detection unit 12 returns to the initial state. Accordingly, the detection signal $S_{det}$ changes from HIGH to LOW. Likewise, the switch unit 13 also returns to the initial state. Accordingly, the PMOS transistor MP1 turns ON and the PMOS transistor MP3 turns OFF.

Thus, when the input signal IN changes from HIGH to LOW, the buffer circuit 100 returns to the initial state. Therefore, the buffer circuit 100 repeats the initial state and the driving state in accordance with a change in the level of the input signal IN. As described above, the buffer circuit 100 can avoid the variation of the internal power supply voltage VINT by the driving current $I_d$.

According to this configuration, it is possible to prevent a phenomenon in which the supplied power supply voltage at a constant level varies by the driving current flowing through the external load even when a variation occurs in the level of the input signal. It is thereby possible to keep the output voltage of the voltage regulator (the internal power supply voltage VINT) constant and maintain the stable operation of a circuit that receives power supply from the voltage regulator.

Further, according to this configuration, because the output voltage of the voltage regulator (the internal power supply voltage VINT) can be kept constant, it is possible to prevent a phenomenon in which periodic noise is superimposed onto the output voltage of the voltage regulator (the internal power supply voltage VINT).

It should be noted that the output voltage of the voltage regulator (the internal power supply voltage VINT) can be kept constant by reducing the output resistance of the voltage regulator. Specifically, the variation of the output voltage of the voltage regulator 1 can be reduced by decreasing the inclination of a line indicating a relationship between the internal power supply voltage VINT and the output current IINT of the voltage regulator 1. However, in order to reduce the output resistance of the voltage regulator, it is necessary to enhance the driving capability of an active element of an output unit of the voltage regulator, increase the charge capacity of the output unit and the like. This results in a significant increase in the layout area of the voltage regulator.

On the other hand, in this configuration, the variation of the output voltage of the voltage regulator (the internal power supply voltage VINT) by the driving current can be prevented only by adding the voltage detection unit and the switch unit with a simple configuration to the buffer circuit. Therefore, the layout area of the voltage regulator does not increase in this configuration. The present configuration is thus advantageous from the viewpoint of the minimization of the circuit layout area as well.

Second Embodiment

Figure 6:
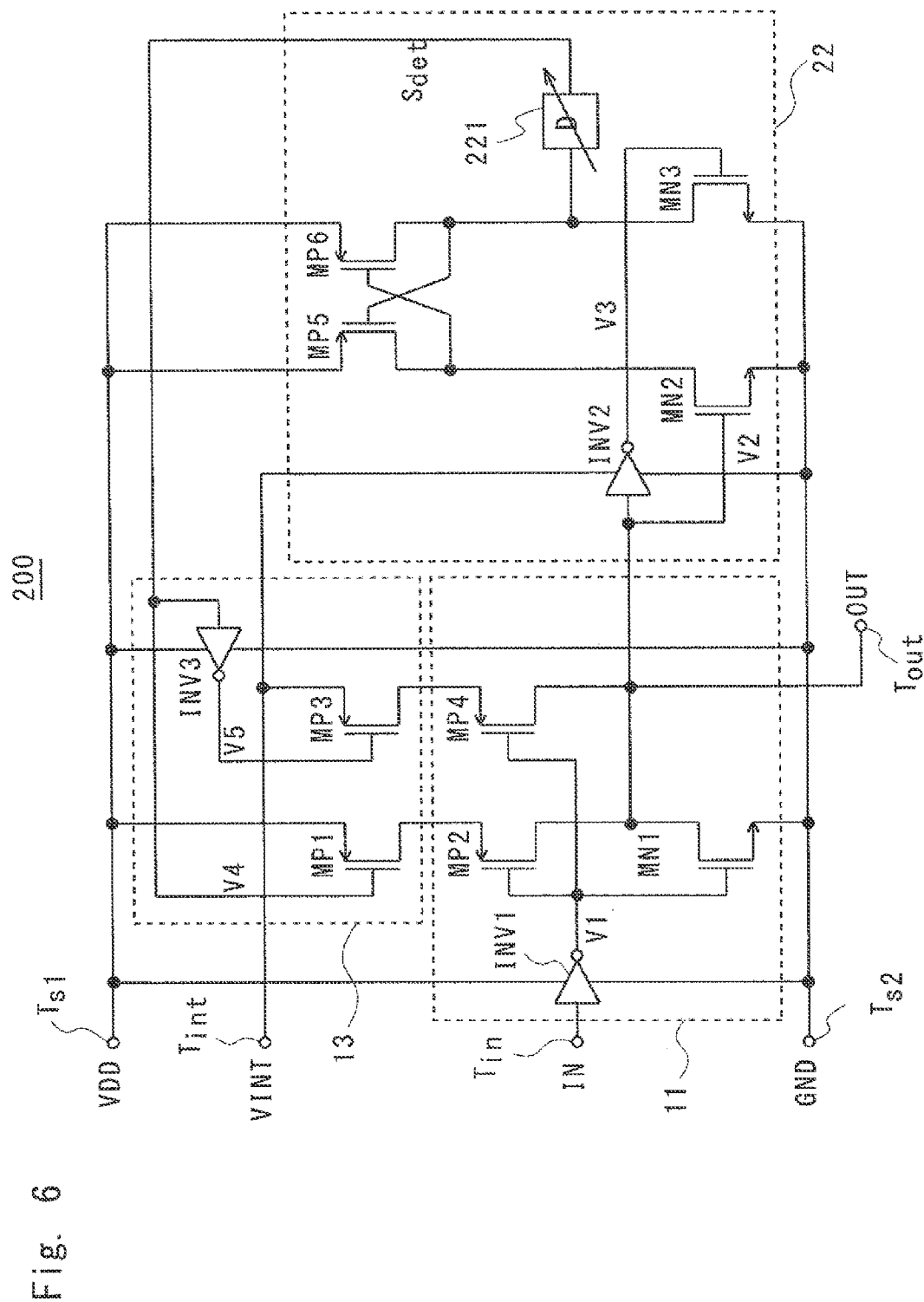
FIG. 6 is a circuit diagram showing a configuration of a buffer circuit 200 according to a second embodiment.

A buffer circuit 200 according to a second embodiment of the present invention is described next. The buffer circuit 200 is configured as a logic circuit that outputs a signal having the same logic level as that of an input signal. FIG. 6 is a circuit diagram showing a configuration of the buffer circuit 200 according to the second embodiment. The buffer circuit 200 has a configuration in which the voltage detection unit 12 of the buffer circuit 100 is replaced by a voltage detection unit 22.

The voltage detection unit 22 has a configuration in which a delay adjuster 221 is added to the voltage detection unit 12 of the buffer circuit 100. The delay adjuster 221 is inserted between the drain of the PMOS transistor MP6 and the switch unit 13. The delay adjuster 221 outputs a signal generated by adding a delay to the voltage level at the drain of the PMOS transistor MP6 as the detection signal $S_{det}$. The amount of delay in the delay adjuster 221 can be adjusted externally. The other configuration and operation principle of the buffer circuit 200 are the same as those of the buffer circuit 100 and thus not redundantly described.

The buffer circuit 200 can adjust the timing to output the detection signal $S_{det}$ by the delay adjuster 221. It is thereby possible to switch the current path at the timing when the voltage of the output signal OUT is close to the internal power supply voltage VINT even when the rise time of the output signal OUT varies at the time of driving various types of the load $C_{load}$. Thus, the buffer circuit 200 does not only have the same effects as the buffer circuit 100 but also has the effect of minimizing the driving current $I_d$ flowing through the current path P2 and further reducing the variation of the internal power supply voltage VINT.

Third Embodiment

Figure 7:
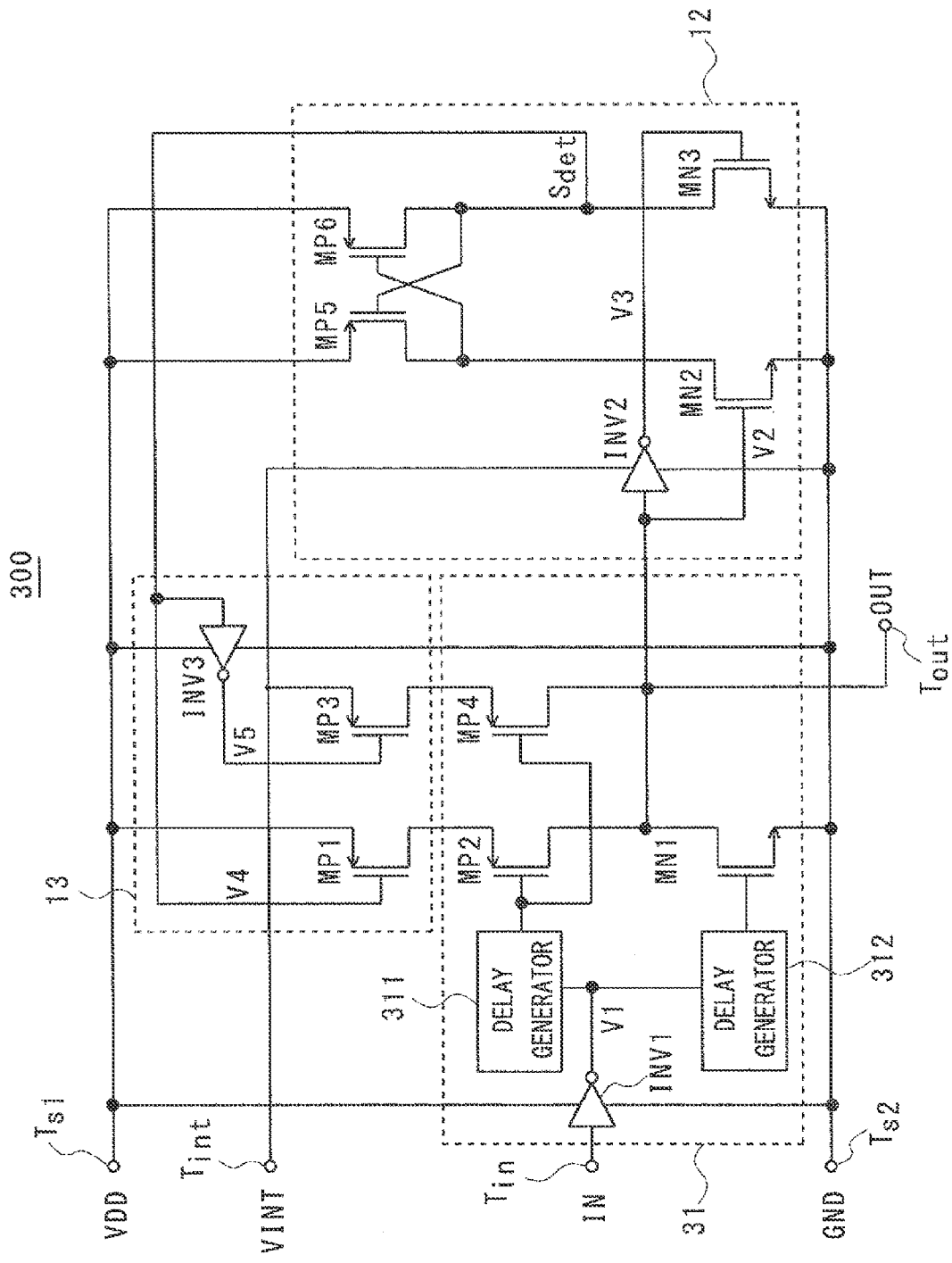
FIG. 7 is a circuit diagram showing a configuration of a buffer circuit 300 according to a third embodiment.

A buffer circuit 300 according to a third embodiment of the present invention is described hereinafter. The buffer circuit 300 is configured as a logic circuit that outputs a signal having the same logic level as that of an input signal. FIG. 7 is a circuit diagram showing a configuration of the buffer circuit 300 according to the third embodiment. The buffer circuit 300 has a configuration in which the buffer unit 11 of the buffer circuit 100 is replaced by a buffer unit 31.

The buffer unit 31 has a configuration in which delay generators 311 and 312 are added to the buffer unit 11 of the buffer circuit 100. The delay generator 311 is inserted between the output of the inverter INV1 and the gates of the PMOS transistors MP2 and MP4. The delay generator 312 is inserted between the output of the inverter INV1 and the gate of the NMOS transistor MN1. The delay generators 311 and 312 output a signal generated by adding a delay to the output of the inverter INV1. The other configuration and operation principle of the buffer circuit 300 are the same as those of the buffer circuit 100 and thus not redundantly described.

In the buffer circuit 300, the timing when the PMOS transistors MP2 and MP4 become ON and the timing when the NMOS transistor MN1 becomes ON can be differentiated by adding different amounts of delay by the delay generator 311 and the delay generator 312. It is thereby possible to prevent the PMOS transistors MP2 and MP4 and the NMOS transistor MN1 from becoming ON state simultaneously. This reduces the through current flowing through the buffer unit 31. Thus, the buffer circuit 300 does not only have the same effects as the buffer circuit 100 but also has the effect of minimizing the through current and further reducing the variation of the internal power supply voltage VINT.

Fourth Embodiment

Figure 8:
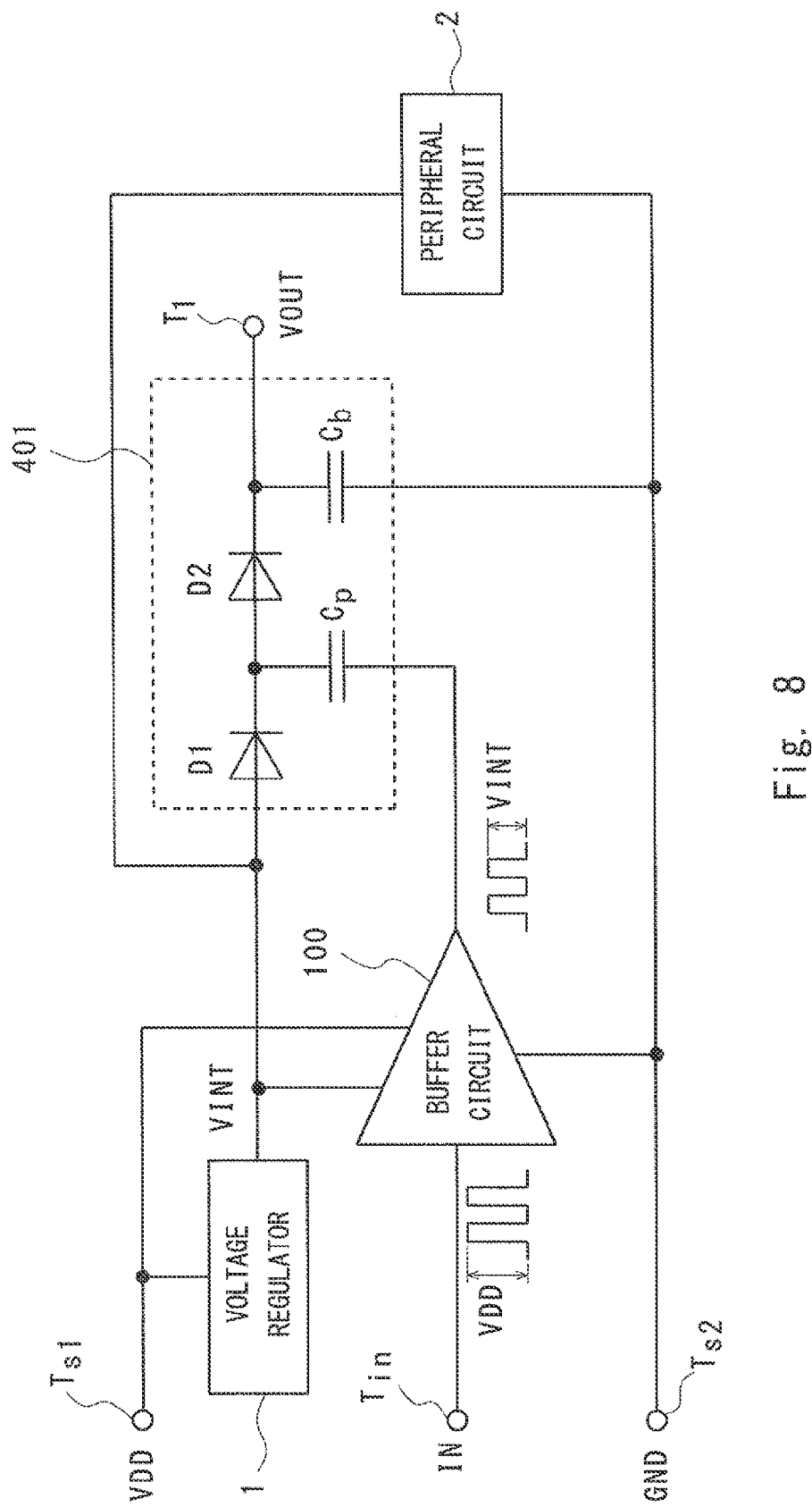
FIG. 8 is a block diagram showing an aspect of use of a buffer circuit 100 according to a fourth embodiment.

Embodiments of the present invention are described hereinbelow. In this embodiment, a charge pump voltage booster 401 is connected as the load $C_{load}$ to the buffer circuits 100, 200 and 300 according to the first, second and third embodiments. A case of using the buffer circuit 100 is described as a representative example below. FIG. 8 is a block diagram showing an aspect of use of the buffer circuit 100 according to the fourth embodiment. The charge pump voltage booster 401 is connected as the load $C_{load}$ to the output of the buffer circuit 100.

In the charge pump voltage booster 401, diodes D1 and D2 are connected in series between the output of the voltage regulator 1 and the output terminal $T_1$. A pump capacitor $C_p$ is connected between the cathode of the diode D1 and the output of the buffer circuit 100. A capacitor $C_b$ is connected between the cathode of the diode D2 and the power supply terminal $T_{s2}$ (the ground voltage GND). The other configuration is the same as that of FIG. 1 and thus not redundantly described.

The voltage regulator 1 converts the external power supply voltage VDD into the internal power supply voltage VINT. The clock signal CLK1 having the amplitude of the external power supply voltage VDD is input as the input signal IN to the buffer circuit 100, and the buffer circuit 100 outputs the clock signal CLK2 having the amplitude of the internal power supply voltage VINT. The internal power supply voltage VINT is input to the charge pump voltage booster 401 to drive the pump capacitor with the clock signal CLK2 having the amplitude of the internal power supply voltage VINT. The charge pump voltage booster 401 then outputs a boosted voltage VOUT. The boosted voltage VOUT is represented by the following equation (1) where Vf is a forward drop voltage of the diodes D1 and D2.

$$VOUT = (VINT - Vf) + VINT - Vf \qquad \text{Equation (1)}$$
$$= 2VINT - 2Vf$$

In this embodiment, the driving current at the time of charging the pump capacitor $C_p$ of the charge pump voltage booster 401 can be reduced with use of the buffer circuit 100. As a result, the variation of the internal power supply voltage VINT can be reduced.

Other Embodiments

The present invention is not restricted to the above-described embodiments, and various changes and modifications may be made without departing from the scope of the invention. For example, although the delay adjuster 221 is included in the voltage detection unit 22 according to the second embodiment, this is just by way of illustration. The delay adjuster may be included in the switch unit. Specifically, the detection signal $S_{det}$ may be input to the delay adjuster that is included in the switch unit, and the output of the delay adjuster may be connected to the gates of the PMOS transistors MP1 and MP2.

Further, the second and third embodiments may be combined. Specifically, a buffer circuit may include the delay adjuster 221 according to the second embodiment and the delay generators 311 and 312 according to the third embodiment. Further, the charge pump voltage booster 401 may be connected to the buffer circuit according to the combination of the second and third embodiments.

The buffer circuits according to the first to third embodiments may be incorporated into a semiconductor integrated circuit as a matter of course. Further, the buffer circuits according to the first to third embodiments can be integrated on the same semiconductor integrated circuit as that of the voltage regulator 1, the peripheral circuit 2, and the charge pump voltage booster 401.

Although the case of using the buffer circuit 100 is described in the fourth embodiment, the buffer circuit 200 or 300 may be used instead as a matter of course.

Further, the circuit configurations of the buffer unit, the voltage detection unit and the switch unit in the buffer circuits according to the first to fourth embodiments described above are just by way of illustration. Therefore, other circuit configurations may be employed as long as the same functions as those described in the first to fourth embodiments are achieved.

Further, in the above embodiments, one or a plurality of peripheral circuits 2 that receive power supply from the voltage regulator 1 may be used. In the case where a plurality of peripheral circuits receive power supply from the voltage regulator 1, the plurality of peripheral circuits may be circuits with the same configuration or circuits with different configurations and functions.

Figure 9:
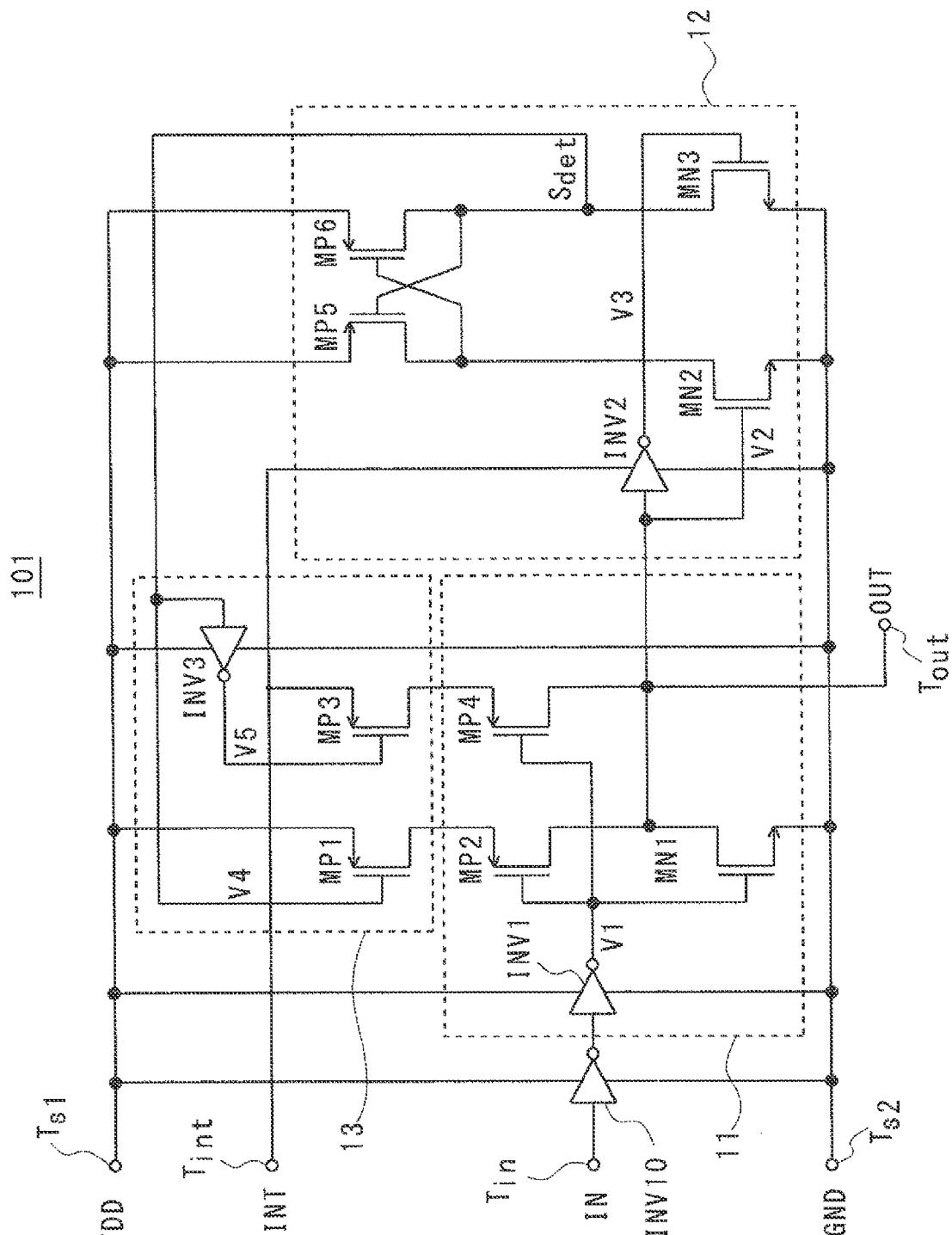
FIG. 9 is a circuit diagram showing a configuration of an inverter circuit 101, which is a modified configuration example of the buffer circuit 100.
Figure 10:
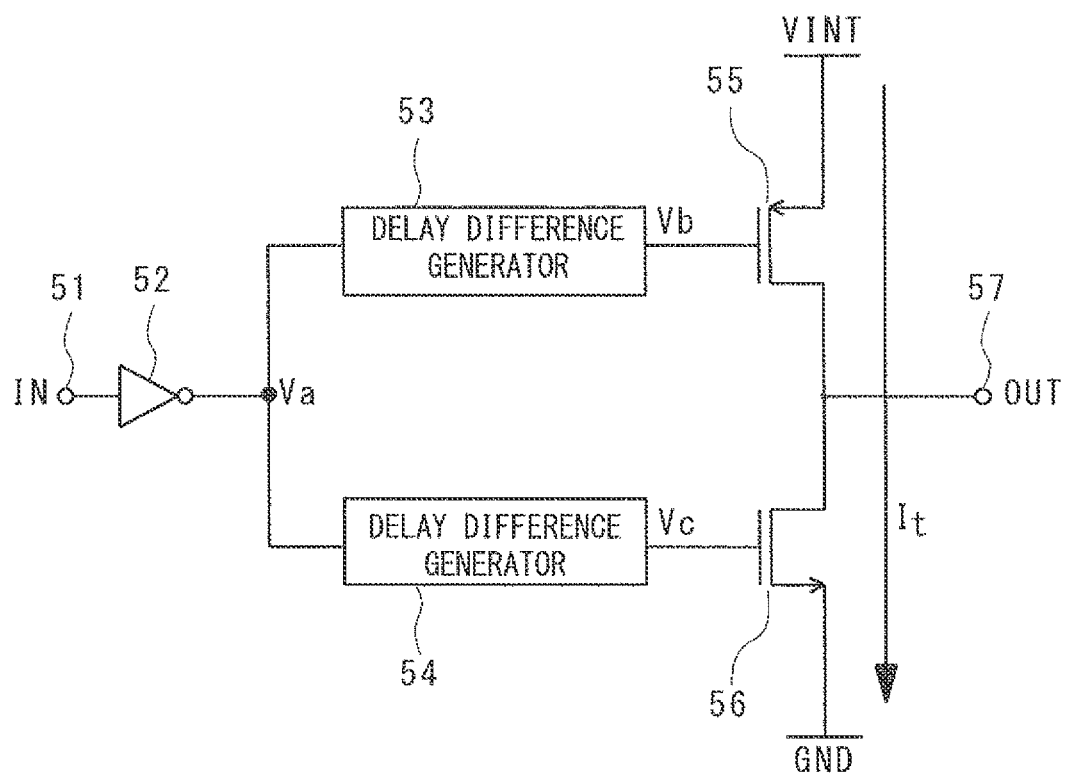
FIG. 10 is a circuit diagram showing a configuration of a typical buffer circuit 500.
Figure 11:
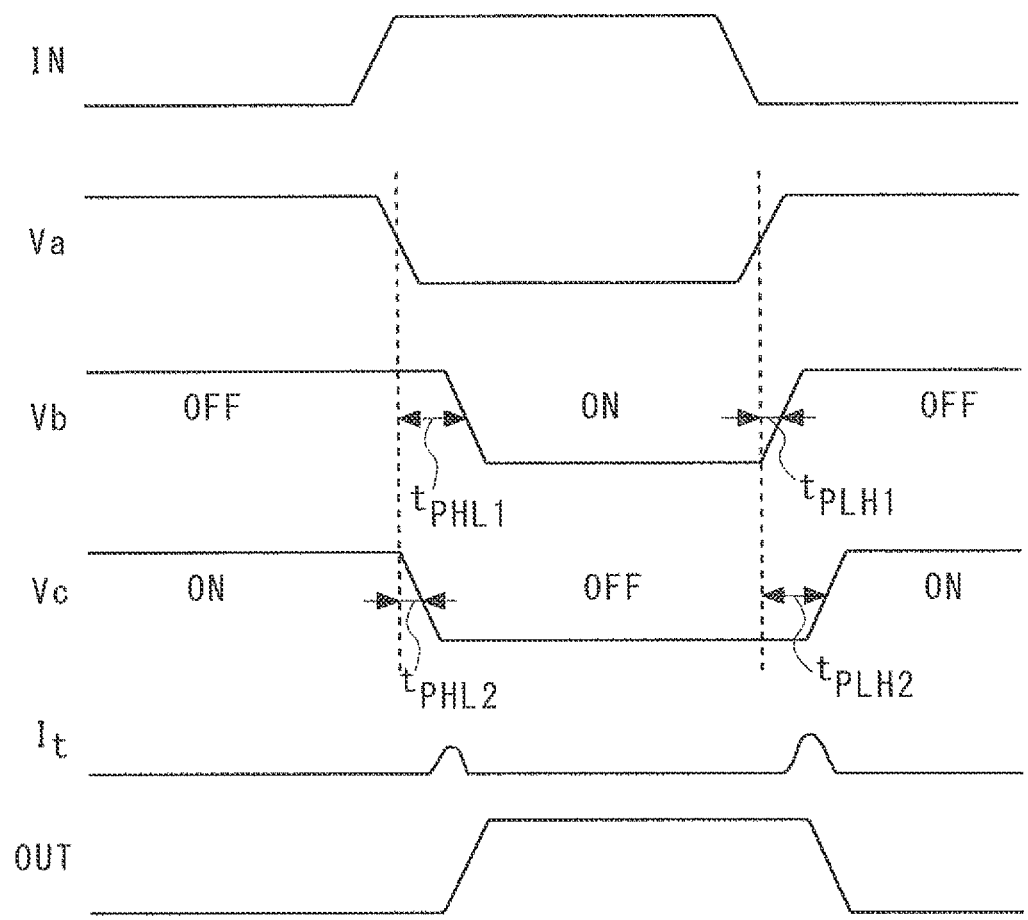
FIG. 11 is a timing chart showing an operation of the buffer circuit 500.
Figure 12:
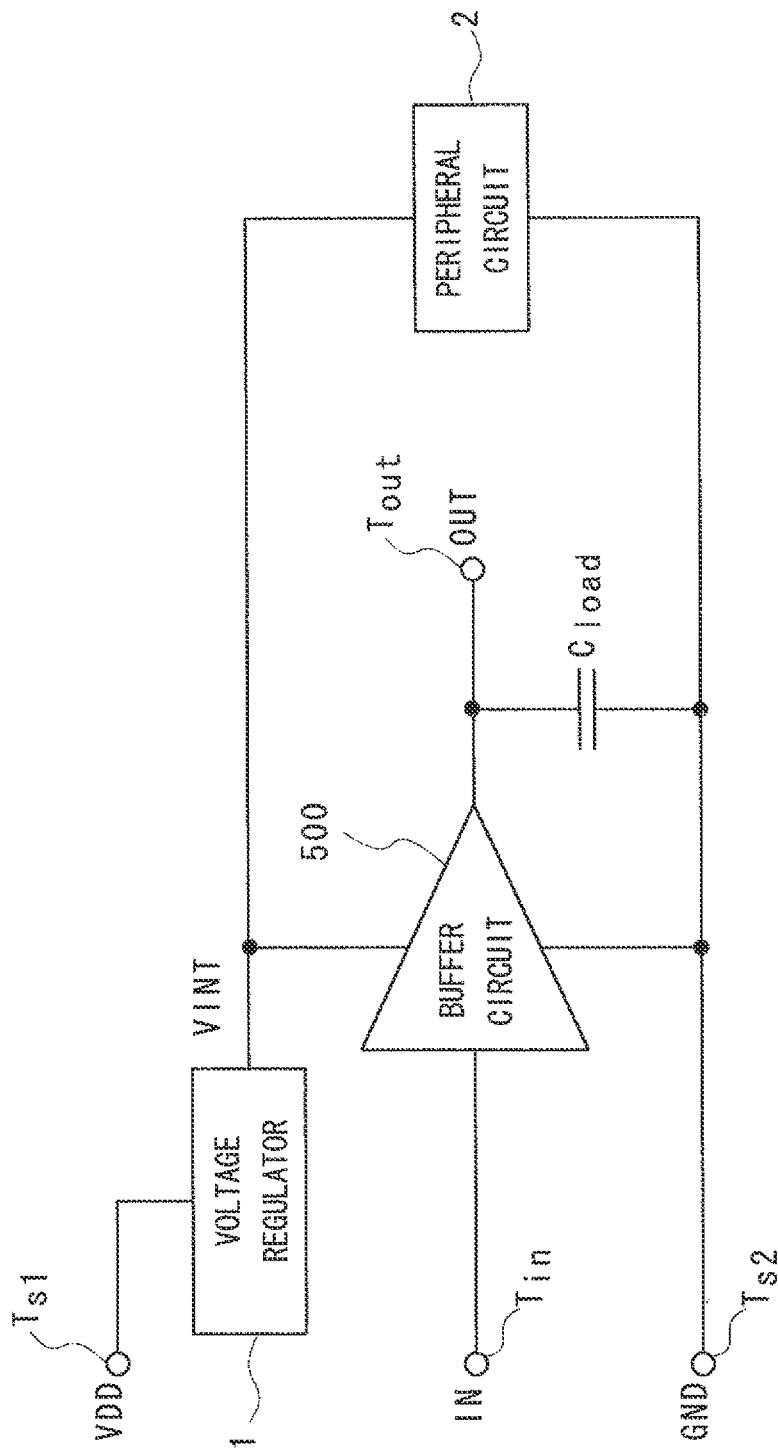
FIG. 12 is a block diagram showing an example of use of the buffer circuit 500.
Figure 13:
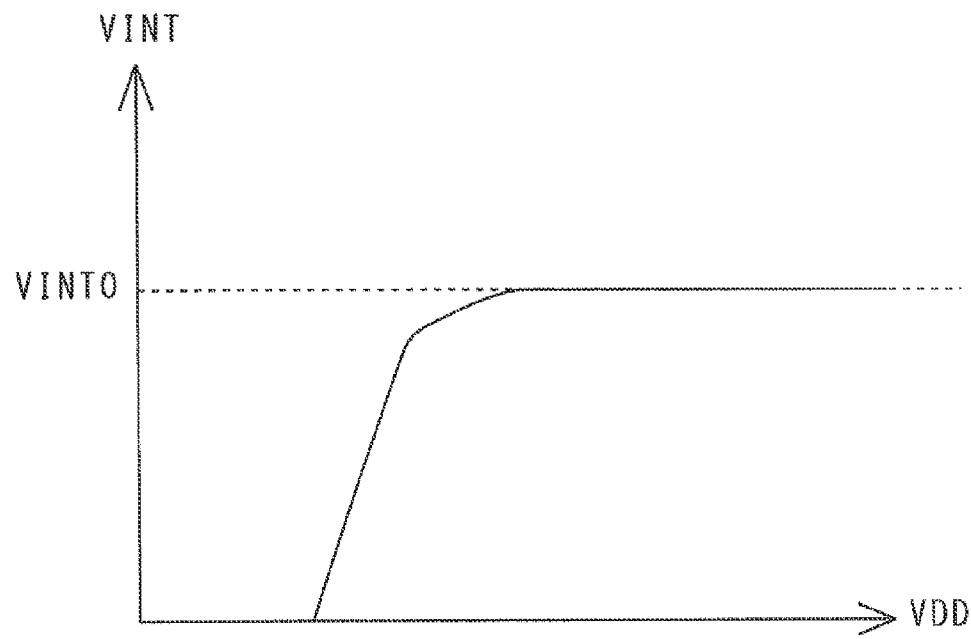
FIG. 13 is a graph showing a relationship between the external power supply voltage VDD and the internal power supply voltage VINT.
Figure 14:
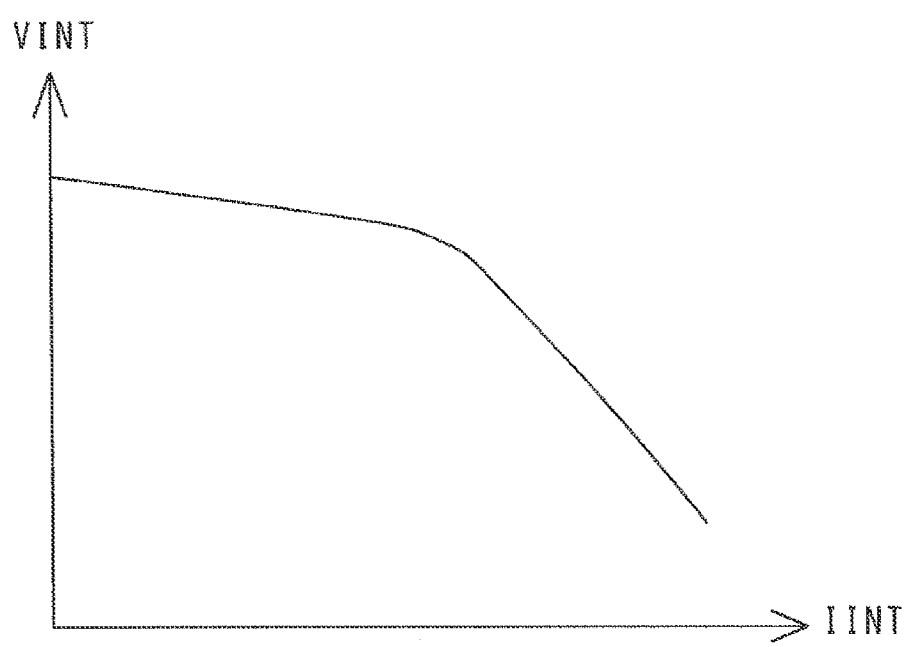
FIG. 14 is a graph showing a relationship between the internal power supply voltage VINT and the output current IINT of the voltage regulator 1.
Figure 15:
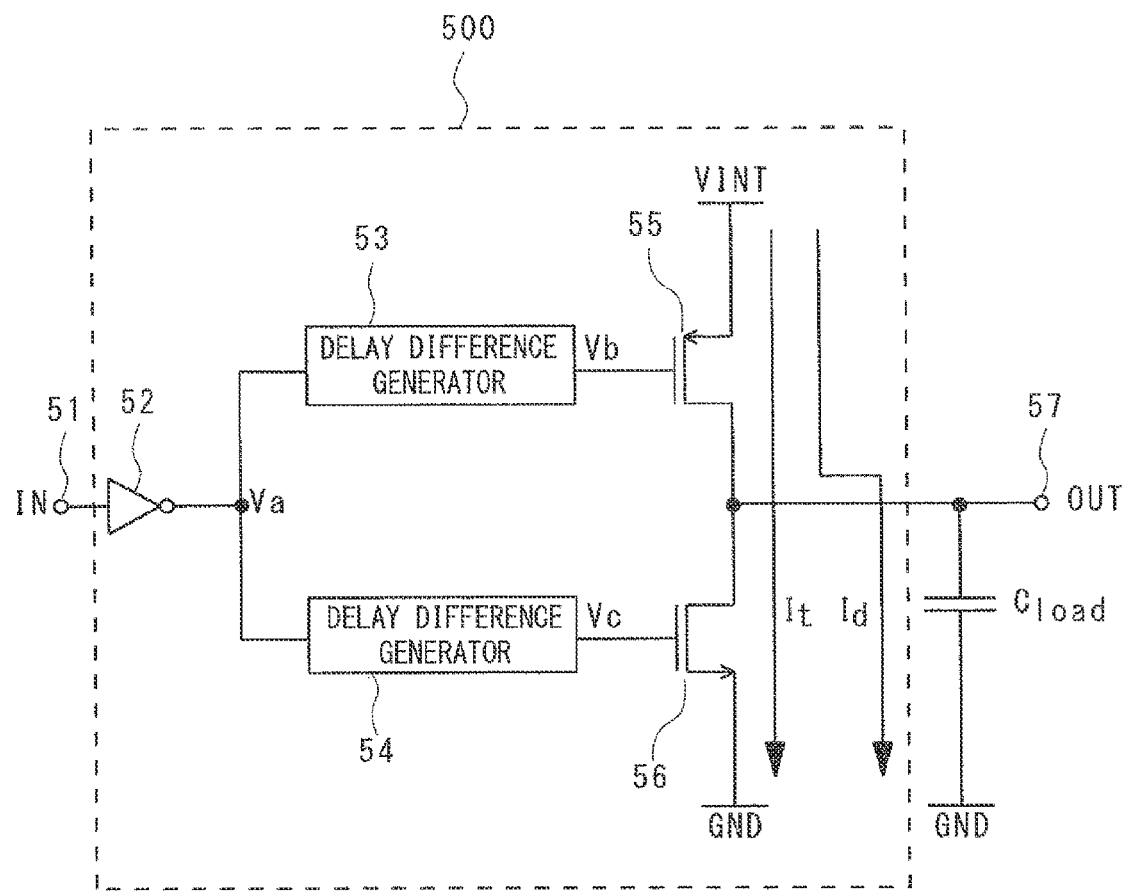
FIG. 15 is a circuit diagram showing current paths of the through current $I_t$ and the driving current $I_d$ in the buffer circuit 500.

Although the buffer circuits 100, 200 and 300 according to the first, second and third embodiments are configured as logic circuits that output a signal having the same logic level as that of an input signal, an output logic is not limited thereto. For example, a logic circuit according to an embodiment of the present invention may be configured as an inverter circuit that outputs a signal having an inverted logic level of that of an input signal. A logic circuit according to an embodiment of the present invention can be easily configured as an inverter circuit by inserting another inverter between the inverter INV1 and the input terminal $T_{in}$ of the buffer circuits 100, 200 and 300 according to the first, second and third embodiments, for example. FIG. 9 is a circuit diagram showing a configuration of an inverter circuit 101, which is a modified configuration example of the buffer circuit 100. As shown in FIG. 9, an inverter INV10 is inserted between the inverter INV1 and the input terminal $T_{in}$ of an inverter circuit 101. The inverter INV10 is connected to the power supply terminals $T_{s1}$ (the external power supply voltage VDD) and $T_{s2}$ (the ground voltage GND) to receive power supply. The other configuration of the inverter circuit 101 is the same as that of the buffer circuit 100 according to the first embodiment and thus not redundantly described. The inverter circuit 101 thereby outputs the output signal OUT having an inverted logic level of the input signal IN. For the buffer circuits 200 and 300 according to the second and third embodiments also, the inverter INV10 may be inserted between the inverter INV1 and the input terminal $T_{in}$.

Although the case where the driving current $I_d$ flows at the rising edge of the input signal IN is described in the above embodiments, the driving current $I_d$ may flow at the falling edge of the input signal IN.

The first to fourth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:
1. A logic circuit comprising:
   a buffer unit that is connected between a first power supply or a voltage regulator and a second power supply to receive power supply, and outputs a signal having the same or inverted logic level as an input signal to an output terminal;
   a voltage detection unit that detects a voltage at the output terminal and outputs a detection signal based on a detection result; and
   a switch unit that connects the buffer unit to the first power supply or the voltage regulator in accordance with the detection signal,
   wherein the voltage detection unit detects whether the voltage at the output terminal is a predetermined value or higher in a state where the buffer unit is connected to the first power supply, and
   when the voltage at the output terminal is the predetermined value or higher, the switch unit connects the buffer unit to the voltage regulator in accordance with the detection signal.
2. The logic circuit according to claim 1, wherein
   when the voltage at the output terminal becomes the predetermined value or higher in a state where the buffer unit is connected to the first power supply, the voltage detection unit makes a level of the detection signal transition, and
   the switch unit connects the buffer unit to the voltage regulator in accordance with transition of the level of the detection signal.
3. The logic circuit according to claim 1, wherein the voltage regulator outputs a voltage converted from a voltage supplied from the first power supply.
4. The logic circuit according to claim 1, wherein the voltage detection unit includes a delay adjuster that adds a delay to the detection signal to be output.
5. The logic circuit according to claim 4, wherein the amount of delay added to the detection signal by the delay adjuster is variable.
6. The logic circuit according to claim 1, wherein the switch unit includes a delay adjuster that adds a delay to the detection signal to be input.
7. The logic circuit according to claim 1, wherein the buffer unit includes:
   a first transistor that has one end connected to the first power supply through the switch unit and turns ON/OFF in accordance with an input signal,
   a second transistor that has one end connected to the voltage regulator through the switch unit and turns ON/OFF in accordance with the input signal,
   a third transistor that has one end connected to other ends of the first and second transistors, has another end connected to the second power supply, and turns ON/OFF in a complementary manner with the first and second transistors,
   a first delay generator that outputs a signal generated by adding a delay to the input signal to control terminals of the first and second transistors, and
   a second delay generator that outputs a signal generated by adding a delay different from the delay of the first delay generator to the input signal to a control terminal of the third transistor.
8. A semiconductor integrated circuit comprising the logic circuit according to claim 1.
9. A logic circuit comprising:
   a buffer unit that is connected between a first power supply or a third power supply and a second power supply to receive power supply, and outputs a signal having the same or inverted logic level as an input signal to an output terminal;
   a voltage detection unit that detects a voltage at the output terminal and outputs a detection signal based on a detection result; and the switch unit that connects the buffer unit to the first power supply or the third power supply in accordance with the detection signal, wherein the voltage detection unit detects whether the voltage at the output terminal is a predetermined value or higher in a state where the buffer unit is connected to the first power supply, and when the voltage at the output terminal is the predetermined value or higher, the switch unit connects the buffer unit to the third power supply in accordance with the detection signal.

10. The logic circuit according to claim 9, wherein the third power supply outputs a constant voltage converted from a voltage supplied from the first power supply.

11. The logic circuit according to claim 9, wherein when the voltage at the output terminal becomes the predetermined value or higher in a state where the buffer unit is connected to the first power supply, the voltage detection unit makes a level of the detection signal transition, and the switch unit connects the buffer unit to the third power supply in accordance with transition of the level of the detection signal.

12. The logic circuit according to claim 9, wherein the voltage detection unit includes a delay adjuster that adds a delay to the detection signal to be output.

13. The logic circuit according to claim 12, wherein the amount of delay added to the detection signal by the delay adjuster is variable.

14. The logic circuit according to claim 9, wherein the switch unit includes a delay adjuster that adds a delay to the detection signal to be input.

15. The logic circuit according to claim 9, wherein the buffer unit includes:

a first transistor that has one end connected to the first power supply through the switch unit and turns ON/OFF in accordance with an input signal, a second transistor that has one end connected to the third power supply through the switch unit and turns ON/OFF in accordance with the input signal, a third transistor that has one end connected to other ends of the first and second transistors, has another end connected to the second power supply, and turns ON/OFF in a complementary manner with the first and second transistors, a first delay generator that outputs a signal generated by adding a delay to the input signal to control terminals of the first and second transistors, and a second delay generator that outputs a signal generated by adding a delay different from the delay of the first delay generator to the input signal to a control terminal of the third transistor.

16. A semiconductor integrated circuit comprising the logic circuit according to claim 9.

* * * * *

UNITED STATES PATENT AND TRADEMARK OFFICE
CERTIFICATE OF CORRECTION

PATENT NO. : 8,922,241 B2  Page 1 of 1
APPLICATION NO. : 13/610341
DATED : December 30, 2014
INVENTOR(S) : Tatsuya Urakawa It is certified that error appears in the above-identified patent and that said Letters Patent is hereby corrected as shown below:

In the Specification

Column 2, Line 24: Delete "$t_{s1}$" and insert -- $T_{s1}$ --

Signed and Sealed this
Fourth Day of August, 2015

Michelle K. Lee
*Director of the United States Patent and Trademark Office*